United States Patent [19]
Umemoto

[11] Patent Number: 4,776,896
[45] Date of Patent: Oct. 11, 1988

[54] AMORPHOUS SILICON SOLAR BATTERY

[75] Inventor: Yoshiyuki Umemoto, Kawasaki, Japan

[73] Assignee: Fuji Electric Co., Ltd., Japan

[21] Appl. No.: 935,186

[22] Filed: Nov. 26, 1986

[30] Foreign Application Priority Data

Nov. 29, 1985 [JP] Japan .................. 60-268638

[51] Int. Cl.⁴ ............................................. H01L 31/04
[52] U.S. Cl. .................... 136/256; 136/244; 136/258; 357/71; 357/30
[58] Field of Search ............. 136/244, 256, 258 AM; 357/30 J, 30 K, 30 Q, 59 C, 71

[56] References Cited

U.S. PATENT DOCUMENTS 4,281,208 7/1981 Kuwano et al. .................. 136/249
4,518,815 5/1985 Yamazaki ......................... 136/244

FOREIGN PATENT DOCUMENTS 57-163753 10/1982 Japan .......................... 136/258 AM
58-39073 3/1983 Japan .......................... 136/258 AM
58-112374 7/1983 Japan .......................... 136/258 AM
58-215082 12/1983 Japan .......................... 136/258 AM Primary Examiner—Aaron Weisstuch
Attorney, Agent, or Firm—Stevens, Davis, Miller & Mosher

[57] ABSTRACT

In an amorphous silicon solar battery having a terminal portion in contact with a spring contact member so that the solar battery is connected to an external output conductor, the outer surface of the terminal portion is formed of a metal layer and an a-Si film lies between the metal layer and a transparent insulated substrate, the a-Si film being adjacent to the metal layer.

4 Claims, 1 Drawing Sheet

AMORPHOUS SILICON SOLAR BATTERY

BACKGROUND OF THE INVENTION

1. Technical Field of the Invention

This invention relates to an amorphous silicon (hereinafter referred to as "a-Si") solar battery in which a terminal portion is brought into contact with a biased spring contact member so that the solar battery is connected to an external outgoing conductor.

2. The Prior Art and Its Problems

It is known that in order to make a solar battery a transparent conductive film, a metal layer, or a metal layer formed on a transparent conductor film is formed on an insulated substrate such as a glass plate used as an electrode. However, a conventional solar battery employing a biased spring contact member as an external output conductor is disadvantageous in that the biasing pressure applied to the terminal portion causes vibration of the contact member and generation of a shear force between adjacent surfaces of the metal contact member and the transparent conductive film and/or insulated substrate so as to cause separation of the substrate and the electrode or separation between the electrode layers.

OBJECT OF THE INVENTION

An object of this invention is to provide an a-Si solar battery in which the above-described difficulties have been eliminated.

It is a further object of this invention to provide an a-Si solar battery in which a bad contact due to separation of the components of the battery is not generated at the terminal portion which comes in contact with a biased spring contact member.

SUMMARY OF THE INVENTION

The foregoing objects of the invention have been achieved by the provision of an a-Si solar battery in which the surface of a terminal portion which comes in contact with a contact member is composed of a metal layer and an a-Si film adjacent to the metal layer lies between the metal layer and a transparent insulated substrate so that a separation is not generated due to high adhesion of the a-Si and the metal layer, as well as the high adhesion between a transparent conductive film or a glass substrate.

DETAILED DESCRIPTION OF THE INVENTION

Figure 1:
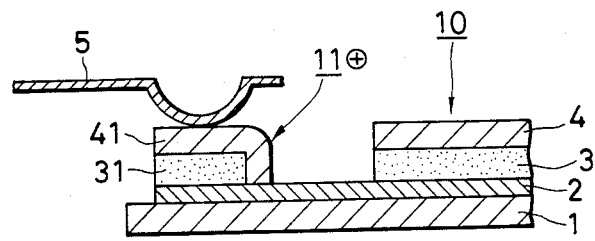
FIG. 1 is a sectional view of a terminal portion having a positive electrode according to one embodiment of this invention.

FIG. 1 illustrates an a-Si solar battery having an electricity generating region 10 according to one embodiment of the invention. The electricity generating region 10 is formed by a transparent conductive film 2 composed of a transparent conductive material such as $InO_2 + SnO_2$ or $SnO_2$, an a-Si film 3, and a metal layer 4 on a glass plate 1 acting as an insulated transparent substrate. The substrate of a terminal portion 11 is formed by an extension of the transparent conductive film 2, on which an a-Si film 31 and a metal layer 41 of the terminal portion 11 are formed in the stated order. The metal layer 41 is formed by evaporating the same metal as the metal layer 4 of the electricity generating region, consisting of a Ti layer or two layers of Al-Ti and Al-Ni. Because a-Si has good adhesion to a metal or transparent conductor material, the a-Si film 31 lying under the metal layer 41 prevents disconnection of the metal layer 41 from the a-Si film 31 or of the a-Si film 31 and the transparent conductive film 2 due to the separating force associated with vibration or shear force caused by a biased spring contact member 5. FIG. 1 illustrates the case of laminating the a-Si film 3 in the PIN order from the substrate side, so that the terminal 11 becomes a positive electrode.

Figure 2:
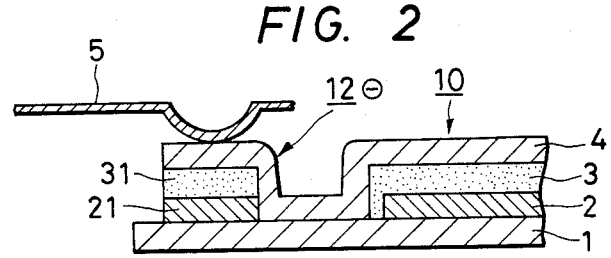
FIG. 2 is a sectional view of the embodiment of FIG. 1 with a terminal portion having a negative electrode.

Conversely, a terminal portion 12 represents a negative electrode which is formed by extending the metal layer 4 over the transparent conductive film 21 and the a-Si film 31 of the terminal portion, as shown in FIG. 2.

Figure 3:
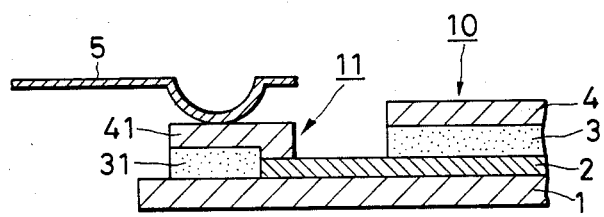
FIG. 3 is a sectional view of a terminal portion having a positive electrode according to a second embodiment of this invention.

FIG. 3 shows a second embodiment having a terminal portion 11 formed as a positive electrode. The terminal portion 11 is formed by a substrate 1, an a-Si film 31 and a metal layer 41, formed in the stated order, with the metal layer 41 being in contact with a transparent conductive film 2 at a position away from the terminal portion 11. In this case, the adhesion of the a-Si layer 31 and the glass plate 1 is good enough to prevent them from separating.

Figure 4:
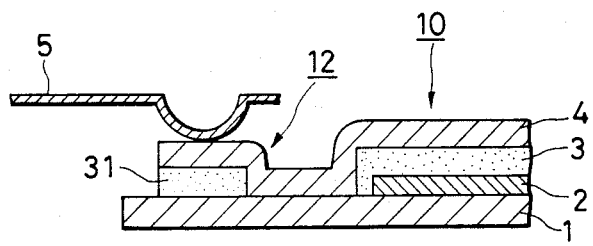
FIG. 4 is a sectional view of a terminal portion having a negative electrode but otherwise similar to that of FIG. 3.

FIG. 4 shows a terminal portion 12 formed as a negative electrode in which an extension of a metal layer 4 extends over an a-Si film 31 of the terminal portion.

Further, the present inventor found that good adhesion of the contact surfaces in a terminal portion is obtained when the terminal position comprises, in the stated order of contact, an a-Si and metal, a transparent conductive material an a-Si and metal, glass an a-Si and metal, an a-Si over a transparent conductive material and glass, an a-Si between metal and glass, even when the metal and glass contact outside the terminal portion and an a-Si between metal and transparent conductive material even where the metal and transparent conductive material contact outside the terminal portion.

According to the present invention, a terminal portion is formed by a substrate or a transparent conductive film, an a-Si film by interposing between the substrate or transparent conductive layer and a metal layer, with the result being that adhesion between the layers or between a layer and a substrate is improved. Separation between adjacent surfaces due to the force caused by a biased spring contact member is avoided and a terminal portion of the present invention is reliable in service.

I claim:

1. An amorphous silicon solar battery comprising a terminal portion in combination with a spring contact member so that the solar battery is connected to an external output conductor, the surface of said terminal portion which comes in contact with said contact member comprising a metal layer and an a-Si film lying between said metal layer and a transparent insulated substrate, said a-Si film being adjacent to said metal layer.

2. The battery of claim 1 in which said metal layer is electrically connected to a transparent conductive film of said battery.

3. The battery of claim 1 in which the metal layer of said terminal portion is electrically connected to a metal layer of said battery.

4. In an amorphous silicon solar battery having a terminal portion in contact with a spring contact member, the improvement comprising the outer surface of said terminal portion being a metal layer, an a-Si film directly beneath said metal layer and an insulated substrate beneath said a-Si film, said a-Si film acting as adhesive agent between said metal layer and said substrate.

* * * * *